(12) United States Patent
Sera et al.

(10) Patent No.: US 7,024,605 B2
(45) Date of Patent: Apr. 4, 2006

(54) FLIP-FLOP AND SCAN PATH CIRCUIT

(75) Inventors: Yoshiaki Sera, Tokyo (JP); Kouji Kanba, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 621 days.

(21) Appl. No.: 10/197,583

(22) Filed: Jul. 18, 2002

(65) Prior Publication Data

US 2003/0066001 A1    Apr. 3, 2003

(30) Foreign Application Priority Data

Jul. 27, 2001   (JP) .............................. 2001-227197

(51) Int. Cl.
*G01R 31/28* (2006.01)
(52) U.S. Cl. .................................... 714/726
(58) Field of Classification Search ................ 714/724, 714/726, 727, 729, 738
See application file for complete search history.

(56) References Cited

U.S. PATENT DOCUMENTS 6,393,592 B1 *   5/2002   Peeters et al. .............. 714/731

FOREIGN PATENT DOCUMENTS

| JP | 62-239071 A | 10/1987 |
|---|---|---|
| JP | H04-72583 A | 3/1992 |
| JP | H07-35823 A | 2/1995 |
| JP | 7-306244 A | 11/1995 |
| JP | H11-85562 A | 3/1999 |
| JP | 2000-2754 A | 1/2000 |
| JP | 2001-196539 A | 7/2001 |

* cited by examiner

*Primary Examiner*—Guy Lamarre
*Assistant Examiner*—James C. Kerveros
(74) *Attorney, Agent, or Firm*—Sughrue Mion, PLLC

(57) ABSTRACT

A scan path flip-flop so adapted that the value of the flip-flop will not be changed by set and reset signals at the time of a shift operation is provided. The scan path flip-flop includes a control terminal for receiving a control signal, which controls mode changeover between a scan path test mode and a normal operation mode; a set terminal for receiving a set signal; and a reset terminal for receiving a reset signal. A first OR gate is provided for inhibiting output of a signal at the set terminal and outputting a fixed value when the control signal is indicative of a scan path test. When the control signal is indicative of a scan path test, therefore, the flip-flop will not be set. A second OR gate is provided for inhibiting output of a signal at the reset terminal RESETB and outputting a fixed value when the control signal is indicative of the scan path test. When the control signal indicates the scan path test, therefore, the flip-flop will not be reset.

3 Claims, 6 Drawing Sheets

FIG . 2

| SMC | SETB | DATA | SIN | RESETB | Q | SOUT | MODE |
|---|---|---|---|---|---|---|---|
| 0 | 1 | DATA | X | ↑ | DATA | DATA | Normal |
| 0 | 0 | X | X | ↑ | 1 | 1 | Set |
| 0 | 1 | x | X | 0 | 0 | 0 | Reset |
| 1 | X | X | SIN | X | SIN | SIN | SCAN Shift |

FLIP-FLOP AND SCAN PATH CIRCUIT

FIELD OF THE INVENTION

This invention relates to a scan path circuit and, more particularly, to the structure of a scan path flip-flop.

DESCRIPTION OF THE RELATED ART

BACKGROUND OF THE INVENTION

The higher integration density and greater functionality of semiconductor integrated circuit devices have been accompanied by use of a scan path circuit to facilitate a device testing. A scan path circuit is such that when the semiconductor integrated circuit device is tested, the flip-flops in the device are connected serially in the manner of a shift register to construct a scan path, a test signal is input from an external terminal and the result of operation by a combinational circuit is read out via the flip-flops connected in the form of a shift register. When the scan path test is conducted using the scan path circuit, each flip-flop latches scan data from a scan-in terminal (SIN) in response to a scan clock (SC) and outputs the data from a scan-out terminal (SOUT) to the scan-in terminal (SIN) of the next flip-flop or to a scan-out external terminal of the semiconductor integrated circuit. For an example of the structure of a scan path flip-flop circuit, see the specification of Japanese Patent Application Laid-Open No. 2000-2754.

FIG. 4 is a diagram illustrating an example of the structure of a conventional flip-flop circuit having a reset function.

As shown in FIG. 4, the flip-flop circuit has a master/slave-type flip-flop structure equipped with a reset/set function. A first NAND gate 101 and a second NAND gate 102 compose a master latch, and a third NAND gate 103 and a fourth NAND gate 104 compose a slave latch.

A first inverter 111 has an input terminal connected to a data terminal DATA, and a first CMOS transfer gate 121, which is turned on and off by a clock signal, is provided between the output terminal of the first inverter 111 and a second input terminal of the first NAND gate 101. A set terminal SETB is connected to the input terminal of a buffer (non-inverting buffer) 110 the output terminal of which is connected to first input terminals of the first and fourth NAND gates 101, 104, respectively.

The output terminal of the first NAND gate 101 is connected to the second input terminal of the second NAND gate 102, the first input terminal of the second NAND gate 102 is connected to a reset terminal (inverting) RESETB, and second and third CMOS transfer gates 122 and 123, respectively, are serially connected between the output terminal of the second NAND gate 102 and the second input terminal of the first NAND gate 101. A first scan clock SC1 and a clock CLK are input to control terminals of the second and third CMOS transfer gates 122 and 123, respectively.

A scan-in input terminal SIN is connected to the input terminal of a second inverter 112, and a fourth CMOS transfer gate 124, which has a control terminal to which the first scan clock SC1 is input, is connected between the output terminal of the second inverter 112 and the connection node of the second and third CMOS transfer gates 122 and 123, respectively.

Fifth and sixth CMOS transfer gates 125 and 126 are serially connected between the output terminal of the first NAND gate 101 and the first input terminal of the third NAND gate 103. The fifth and sixth CMOS transfer gates 125 and 126 have control terminals to which a second scan clock SC2 and the clock CLK, respectively, are input. The third NAND gate 103 has a second input terminal connected to the reset terminal RESTB.

The third NAND gate 103 has its output end connected to an output terminal Q via a third inverter 113, and the third NAND gate 103 has its output end connected to the second input terminal of the fourth NAND gate 104. As mentioned above, the first input terminal of the fourth NAND gate 104 is connected to a set terminal SETB.

A seventh CMOS transfer gate 127, which is turned on and off by the clock signal CLK, is connected between the output terminal of the fourth NAND gate 104 and the input terminal of the third NAND gate 103. An eighth CMOS transfer gate 128, which is turned on and off by the second scan clock SC2, is connected between the output terminal of the fourth NAND gate 104 and the node of the fifth and sixth CMOS transfer gates 125 and 126.

An inverted clock CLKB and the uninverted clock CLK are supplied to the gates of a P-channel MOS transistor and N-channel MOS transistor of the first and seventh CMOS transfer gates 121 and 127, and the uninverted clock CLK and inverted clock CLKB are supplied to the gates of a P-channel MOS transistor and N-channel MOS transistor of the third and sixth CMOS transfer gates 123 and 126. It should be noted that inverted clock CLKB is obtained as a result of inverting the clock CLK by an inverter INV1.

The uninverted scan clock SC1 and an inverted scan clock SC1B are supplied to the gates of a P-channel MOS transistor and N-channel MOS transistor of the second CMOS transfer gate 122. It should be noted that the inverted scan clock SC1B is obtained as a result of inverting the uninverted scan clock CLK by an inverter INV2.

The inverted scan clock SC1B and the uninverted scan clock SC1 are supplied to the gates of a P-channel MOS transistor and N-channel MOS transistor of the fourth CMOS transfer gate 124.

An inverted scan clock SC2B and the uninverted scan clock SC2 are supplied to the gates of a P-channel MOS transistor and N-channel MOS transistor of the fifth CMOS transfer gate 125. The inverted scan clock SC2B is obtained as a result of inverting the uninverted scan clock SC2 by an inverter INV3. It should be noted that the scan clocks SC1 and SC2 are assumed below to be two-phase signals that do not overlap.

The uninverted scan clock SC2 and inverted scan clock SC2B are supplied to the gates of a P-channel MOS transistor and N-channel MOS transistor of the eighth CMOS transfer gate 128.

During ordinary operation, the first scan clock SC1 is fixed at the low level, the second scan clock SC2 is fixed at the high level and only the clock CLK is supplied.

As a result of the scan clocks SC1 and SC2 being fixed at low and high levels, respectively, the second CMOS transfer gate 122 is placed in the ON state, the fourth CMOS transfer gate 124 in the OFF state, the fifth CMOS transfer gate 125 in the ON state and the eighth CMOS transfer gate 128 in the OFF state, and the input path from the scan-in terminal SIN to the master latch and the connection path between the slave latch and the scan-out terminal SOUT are cut.

Normal operation when both the set and reset signals are inactive will now be described.

FIG. 5 is a timing chart useful in describing operation of the circuit of FIG. 4 when the circuit is functioning normally. When the set signal (inverted) SETB is inactive (at the high level), the first and fourth NAND gates 101 and 104 take on logic equivalent to that of inverter elements. When the reset signal RESETB is inactive (at the high level), the second and third NAND gates 102 and 103 take on logic equivalent to that of inverter elements.

When the clock CLK is at the high level (CLKB is at the low level), the first and seventh CMOS transfer gates 121 and 127 turn on and the third and sixth CMOS transfer gates 123 and 126 turn off.

Conversely, when the clock CLK is at the low level (CLKB is at the high level), the third and sixth CMOS transfer gates 123, 126 turn on and the first and seventh CMOS transfer gates 121, 127 turn off.

When the clock signal CLK is at the high level, which is at time T1 in FIG. 5, a signal that is the result of inverting the signal level of the data (DATA) terminal enters the second input terminal of the first NAND gate 101. The latter inverts this value, which is the result of inverting the signal logic of the DATA terminal, and inputs the inverted value to the second input terminal of the second NAND gate 102.

When the clock signal CLK falls to the low level, which occurs at time T2, the sixth CMOS transfer gate 126 turns on, the output of the first NAND gate 101 is transmitted to the first input terminal of the third NAND gate 103 via the ON fifth and sixth CMOS transfer gates 125, 126, the third NAND gate 103 supplies the input terminal of the third inverter 113 and the second input terminal of the fourth NAND gate 104 with a signal obtained by inverting the logic value at the first input terminal of the third NAND gate 103, and the output of the third NAND gate 103 is inverted by the inverter 113 and output from the output terminal Q. Further, the fourth NAND gate 104 (the first input terminal of which is connected to the SETB terminal and is at the high level) outputs a signal, which is the result of inverting the logic value at the second input terminal of the fourth NAND gate 104, to the scan-out terminal SOUT. At this time the first CMOS transfer gate 121 turns off, the connection between the second input terminal of the first NAND gate 101 and the data terminal is severed, the third CMOS transfer gate 123 turns on and the master latch latches the input data.

When the clock signal CLK rises to the high level, which occurs at time T3, the sixth CMOS transfer gate 126 turns off and the master latch and slave latch are cut off from each other. In the slave latch, the seventh CMOS transfer gate 127 turns on so that the output of the fourth NAND gate 104 is connected to the input of the third NAND gate 103, whereby the slave latch latches the data. It should be noted that if the second scan path clock SC2 and the inverted signal SC2B thereof connected to the gates of the P-channel MOS transistors and N-channel MOS transistors of the fifth and eighth CMOS transfer gates 125, 128 are made the opposite of the what is shown in FIG. 4, the second scan path clock SC2 will be fixed at the low level.

A shift operation performed at the time of a scan path test will now be described. At the time of a scan path test, the clock CLK is fixed at the low level. The first and seventh CMOS transfer gates 121, 127 turn off and the third and sixth CMOS transfer gates 123, 126 turn on.

FIG. 6 is a timing chart useful in describing operation of the circuit of FIG. 4 at the time of a scan shift.

When the first scan clock SC1 is at the high level (the second scan clock SC2 is at the low level), which is at time T1 in FIG. 6, a signal that is the result of inverting the signal at the scan-in terminal SIN enters the second input terminal of the first NAND gate 101 via the fourth CMOS transfer gate 124 and third CMOS transfer gate 123. The output of the first NAND gate 101 (the signal logic at the SIN terminal) enters the second input terminal of the second NAND gate 102. When the first scan clock SC1 is at the high level (SC2 is at the low level), the second CMOS transfer gate 122 is off.

When the first scan clock SC1 falls to the low level (SC2 is at the low level), which occurs at time T2, the fourth CMOS transfer gate 124 turns off, the electrical connection between the scan-in terminal SIN and master latch is severed, the second CMOS transfer gate 122 turns on, the equivalent of a two-inverter flip-flop, which comprises the first and second NAND gates 101, 102 of the master latch, is formed, and the signal at the scan-in terminal SIN is latched.

When the scan clock SC2 rises to the high level (SC1 is at the low level), which occurs at time T3, the fifth CMOS transfer gate 125 turns on, the output of the first NAND gate 101 (i.e., the signal logic at the SIN terminal) is input to the second input terminal of the third NAND gate 103 via the fifth CMOS transfer gate 125 and sixth CMOS transfer gate 126, the output of the third NAND gate 103 (the logic value obtained by inverting the signal at the SIN terminal) enters the second input terminal of the fourth NAND gate 104, and the output of the fourth NAND gate 104 (the signal which is the inverse of the output of the third NAND gate 103) is delivered from the scan-out terminal SOUT. That is, a signal whose logic is the same as that of the output terminal Q is output also as the scan-out terminal SOUT. In FIG. 4, a terminal (QB) for providing the inverse of the signal at the output terminal Q is not shown. However, the inverted output signal is obtained from a terminal connected to the node between the output terminal of the third NAND gate 103 and the third inverter 113 (or it may be obtained via a non-inverting buffer).

When the scan clock SC2 reverts to the low level at time T4, the fifth CMOS transfer gate 125 turns off and the slave latch is severed from the master latch. In the slave latch, the eighth CMOS transfer gate 128 turns on, the equivalent of a two-inverter flip-flop, which comprises the third and fourth NAND gates 103, 104, is formed, and the data is latched. It should be noted that if the second scan path clock SC2 and the inverted signal SC2B thereof connected to the gates of the P-channel MOS transistors and N-channel MOS transistors of the fifth and eighth CMOS transfer gates 125, 128 are made the opposite of the what is shown in FIG. 4, the second scan path clock SC2 will become a signal that is the inverse of the signal shown in FIG. 6 (i.e., the high/low levels of the signal will be reversed).

Operation in a case where the set terminal SETB is active (at the low level) at the time of normal operation will now be described. In this case, the reset terminal RESETB is inactive (at the high level).

When the set terminal SETB assumes the low level, the output of the first NAND gate 101, whose first input terminal has been placed at the low level, and the output of the fourth NAND gate 104 both assume the high level. When the clock CLK is at the low level, the sixth CMOS transfer gate 126 turns on, the output signal of the first NAND gate 101 is transmitted to the first input terminal of the third NAND gate 103, and the third NAND gate 103 inverts and outputs the signal level (high in this case) of its first input terminal (the second input terminal of the third NAND gate 103 is connected to the RESETB terminal and is at the high level). As a result, a high level is output from the output terminal Q. At this time the output terminal of the fourth NAND gate 104 delivers a high-level signal also to the scan-out terminal SOUT asynchronously with respect to the clock.

When the clock CLK attains the high level, the seventh CMOS transfer gate 127 turns on, the sixth CMOS transfer gate 126 turns off (the slave latch is disconnected from the master latch) and the high level from the output terminal of the fourth NAND gate 104 enters the first input terminal of the third NAND gate 103. As a result, the state is maintained at the high level of the output terminal Q.

Next, operation in a case where the reset terminal RESETB is active (at the low level) at the time of normal operation will be described. In this case, the set terminal SETB is inactive (at the high level).

When the reset terminal RESETB assumes the low level, the outputs of the second and third NAND gates 102, 103 attain the high level, the output of the third NAND gate 103 is inverted and output by the third inverter 113, and the output terminal Q delivers the low level asynchronously. At this time, the first and second input terminals of the fourth NAND gate 104 attain the high level and the output terminal of the fourth NAND gate 104 delivers the low level to the scan-out terminal SOUT.

In response to the low level of the clock CLK, the third CMOS transfer gate 123 turns on, the high level is supplied to the second input terminal of the first NAND gate 101 and the first NAND gate 101 outputs the low level because its first input terminal is at the high level (SETB). This low-level signal is output to the first input terminal of the third NAND gate 103.

In response to the high level of the clock CLK, the seventh CMOS transfer gate 127 turns on, the sixth CMOS transfer gate 126 turns off and a low level is supplied to the first input terminal of the third NAND gate 103 from the output terminal of the fourth NAND gate 104.

Operation in a case where the set terminal SETB is active (at the low level) at the time of the scan path test will now be described. In this case, the reset terminal RESETB is inactive (at the high level). The clock CLK is placed at the low level, the first and seventh CMOS transfer gates 121, 127 turn off and the third and sixth CMOS transfer gates 123, 126 turn on.

At the moment the set terminal SETB assumes the low level, the fourth NAND gate 104 immediately outputs the high level and the high level is output to the scan-out terminal SOUT asynchronously.

The output terminal of the first NAND gate 101 whose first input terminal is connected to the set terminal SETB attains the high level, the fifth CMOS transfer gate 125 is turned on owing to the high level of the second scan clock SC2, the output signal of the first NAND gate 101 is transmitted to the first input terminal of the third NAND gate 103, the third NAND gate 103 inverts and outputs the signal level at its first input terminal, and the output of the third NAND gate 103 is inverted and output by the third inverter 113, whereby a high level is output.

When the scan clock SC2 reverts to the low level, the eighth CMOS transfer gate 128 turns on, the fifth CMOS transfer gate 125 turns off and the high level is input to the first input terminal of the third NAND gate 103. As a result, the high level at the scan-out terminal SOUT is latched.

Next, operation in a case where the reset terminal RESETB is active (at the low level) at the time of the scan test will be described. In this case, the set terminal SETB is inactive (at the high level).

When the reset terminal RESETB assumes the low level, the outputs of the second and third NAND gates 102, 103 attain the high level, the logic at the output of the third NAND gate 103 is inverted and output by the third inverter 113, the low level is output at the output terminal Q and the output terminal of the fourth NAND gate 104 delivers the low level also to the scan-out terminal SOUT. In other words, the scan-out terminal SOUT outputs the low level asynchronously irrespective of the scan clock.

Furthermore, in response to the low level of the scan clock SC1, the second CMOS transfer gate 122 turns on, the high level is supplied to the second input terminal of the first NAND gate 101, and the first NAND gate 101 outputs the low level because its first input terminal is at the high level (SETB). This low-level signal is output to the first input terminal of the third NAND gate 103.

In response to the low level of the scan clock SC2, the eighth CMOS transfer gate 128 turns on, the fifth CMOS transfer gate 125 turns off and the low level output of the fourth NAND gate 104 is supplied to the first input terminal of the third NAND gate 103, whereby the slave latch latches the output signal.

In order for the operation of the shift register constructing the scan path to be carried out correctly, it must be so arranged that the values of the scan path flip-flops will not be changed by the shift operation.

More specifically, when the input from the reset terminal RESETB for inputting the signal from the logic circuit that generates the reset signal is set from the high level to the low level or falls to the low level owing to noise or the like at the time of the scan path test, an erroneous signal will propagate through the shift register if the output SOUT of the scan path flip-flop is forcibly reset to the low level and this output is input to the scan-in terminal of the scan path flip-flop of the next stage. This holds true for the set signal as well.

In order to so arrange it that an active signal will not be supplied to the set and reset terminals of the scan path flip-flop owing to operation of the logic circuit, which supplies the set and reset signals, at the time of the scan path test, it is necessary to supply a pattern that will control the set/reset signal generating logic circuit in such a manner that this circuit will not operate at the time of test. Furthermore, it is necessary to perform the test with a pattern and timing margin that will not produce glitch noise or the like in the reset and set signals. As a consequence, automatic pattern design and testing is difficult.

A scan path flip-flop not having a set and/or reset function can have its output provided with a holding circuit for holding data, and circuit design is possible without taking a change in the output logic of the flip-flop into account at the time of the shift operation. Such as arrangement is disclosed in, e.g., the specification of Japanese Patent Application Laid-Open No. 62-239071. However, even if the output terminal of a scan path flip-flop equipped with a set and/or reset function is provided with a holding circuit, any change in state caused by setting or resetting of the flip-flop at the time of a shift operation during a scan path test will be transmitted to the next flip-flop stage.

Further, the specification of Japanese Patent Application Laid-Open No. 7-306244, for example, discloses a flip-flop in which a logic circuit is connected to set and reset terminals. Specifically, this specification discloses a flip-flop in which the outputs of a first AND element and second AND element are connected to the set and reset terminals, respectively, one input terminal of the second AND element is connected to the output of an inverting element, one input of the first AND element and the other input of the second AND element are made a load timing (LT) input, and the other input of the first AND element and input of the inverting element are made load data (LD). It is so arranged that an asynchronous clock is supplied to the flip-flop directly at the time of ordinary operation and that the scan path of the flip-flop is constructed when a test is performed. At the time of ordinary operation, a circuit-design limitation to the effect that a synchronous clock must not be used is eliminated, and an asynchronous clock is supplied to the flip-flop directly without the intermediary a selector. This solves the problem that high-speed operation, in which a deviation in clock skew at the time of ordinary operation becomes an obstacle, is difficult to achieve in a case where the asynchronous clock for ordinary operation or the synchronous clock for the test operation is being supplied as the flip-flop clock via the selector. However, even this circuit arrangement does not make it possible to avoid erroneous setting of set and reset when a shift operation is performed during a scan path test.

SUMMARY OF THE DISCLOSURE

Accordingly, it is an object of the present invention to provide a flip-flop and scan path circuit so adapted that when a shift operation is performed, the value indicated by a scan path flip-flop will not change owing to input of set and reset signals, thereby assuring that operation of a shift register constructing the scan path will be performed correctly.

Another object of the present invention is to provide a flip-flop and scan path circuit that contributes to simplification of the circuit design process relating to semiconductor integrated circuit devices and that simplifies testing of semiconductor integrated circuit devices.

The above and other objects of the invention are attained by providing a scan path circuit in accordance with one aspect of the present invention, which includes circuit means for inhibiting transmission of a set signal when a control signal for controlling mode changeover between a scan path test and ordinary operation indicates a scan path test mode. A scan path circuit in accordance with the present invention is equipped with circuit means for inhibiting transmission of a reset signal when a control signal for controlling mode changeover between a scan path test and ordinary operation indicates a scan path test mode. These circuit means are preferably provided internally of the flip-flop.

Further, a flip-flop in accordance with the present invention, receiving and latching a data signal from a data terminal in a normal operation, and receiving and latching a signal from a scan input terminal in a scan path test operation, comprises: a control terminal for receiving a control signal, which controls mode changeover between a scan path test mode and a normal operation mode; a set terminal for receiving a set signal, which sets the state of the flip-flop; and a logic circuit, to which the signals from the control terminal and set terminal are entered, for exercising control so as to inhibit transmission of the set signal, which has been entered from the set terminal, when the control signal indicates the scan path test mode, thereby not allowing the state of the flip-flop to be set by the entered set signal.

Further, in accordance with the present invention, the above and other objects of the invention are attained by providing a flip-flop for receiving and latching a data signal from a data terminal in a normal operation, and receiving and latching a signal from a scan input terminal in a scan path test operation, the flip-flop comprising: a control terminal for receiving a control signal, which controls mode changeover between a scan path test mode and a normal operation mode; a reset terminal for receiving a reset signal, which resets the state of the flip-flop; and a logic circuit, to which the signals from the control terminal and reset terminal are input, for exercising control so as to inhibit transmission of the reset signal, which has been entered from the reset terminal, when the control signal indicates the scan path test mode, thereby not allowing the state of the flip-flop to be reset by the entered reset signal.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 2 is a truth table illustrating the operation of the flip-flop according to this embodiment;

PREFERRED EMBODIMENTS OF THE INVENTION

The present invention will now be described in detail.

A design tool or technique used in the automated design system of semiconductor integrated circuit devices searches for flip-flops having set and reset terminals in a net list of circuit design information following logic synthesis, and automatically inserts (by computer) control buffer circuits, which are for masking set and reset signals from other logic circuits, at the set and reset terminals of the flip-flop when a scan path test is conducted. This technique will now be described.

Figure 3:
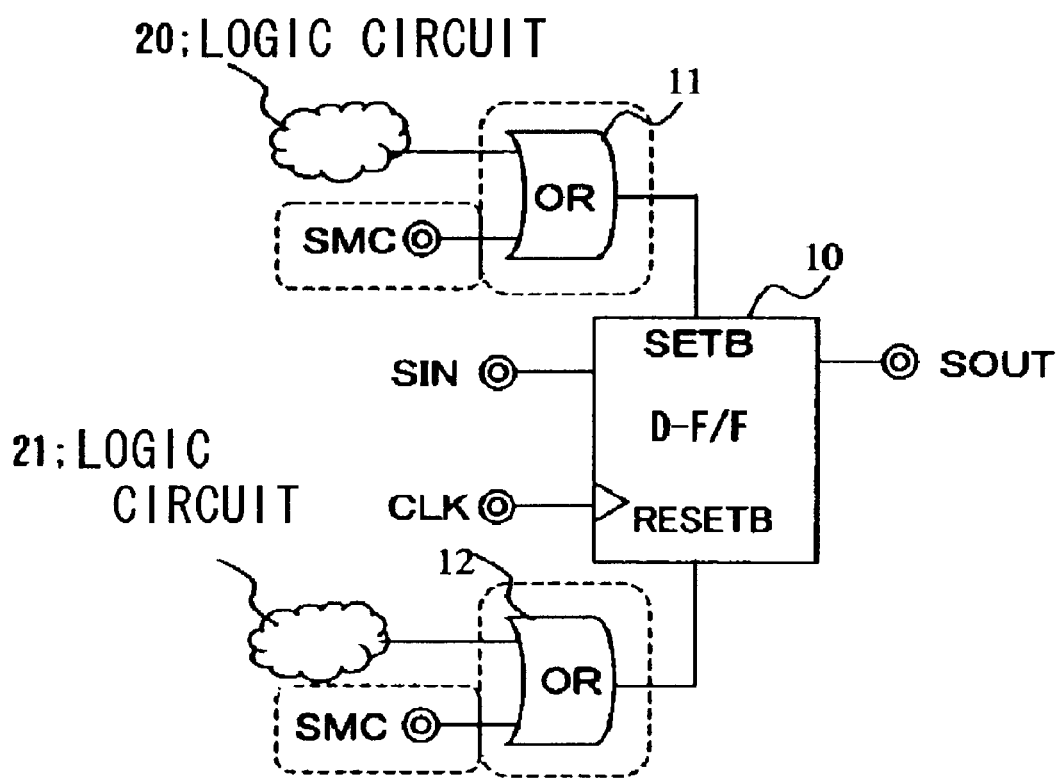
FIG. 3 is a diagram useful in describing control performed by a control buffer circuit.

FIG. 3 is a diagram schematically illustrating the structure of a scan path circuit in which control buffer circuits have been newly inserted. A flip-flop 10 in FIG. 3 has a structure similar to that illustrated in FIG. 4.

The flip-flop 10 has the set terminal SETB and the reset terminal RESETB. A control buffer circuit, which has its output terminal connected to the set terminal SETB, masks a set signal, which is output from a logic circuit 20, when a scan path test is conducted. The control buffer circuit is constituted by a first OR gate 11 for outputting, to the set terminal SETB, the result of an OR operation between a control signal SMC (Scan path test Mode Control), which designates the scan path test mode or the normal operation mode, and the set signal from the logic circuit 20 that generates and transmits the set signal. Another control buffer circuit, which has its output terminal connected to the reset terminal RESETB, masks a reset signal, which is output from a logic circuit 21, when the scan path test is conducted. This control buffer circuit is constituted by a second OR gate 12 for outputting, to the reset terminal RESETB, the result of an OR operation between a control signal of the scan path test mode and the reset signal from the logic circuit 21 that generates and transmits the reset signal.

The scan path circuit having the structure shown in FIG. 3 operates as follows: When the control signal SMC is at the high level (indicative of the scan path test mode), the outputs of the first and second OR gates 11 and 12 are always at the high level, low-level signals are not supplied to the set terminal SETB and reset terminal RESETB of flip-flop 10, and therefore the flip-flop 10 does not perform a setting or resetting operation. As a result, the flip-flop 10 is not set or reset at the time of a shift operation.

When the control signal SMC is at the low level (indicative of the normal operation mode), on the other hand, the first and second OR gates 11 and 12 produce signals corresponding to set and reset signals, respectively, and these are supplied to the set terminal SETB and reset terminal RESETB, respectively, of the flip-flop 10. The flip-flop 10 performs a setting or resetting operation in dependence upon the logic values of the signals input thereto. This technique makes it possible to solve the aforementioned problems, as set forth above.

With regard to the above-described technique, however, the points mentioned below should be taken into consideration.

It is required at the circuit design phase that the control buffer circuits be inserted separately between the logic circuits 20 and 21, which respectively generate the set and reset signals, and the set terminal SETB and reset terminal RESETB, respectively, of the flip-flop 10. In other words, in the design of a large-scale integrated circuit (LSI), control buffer circuits are inserted at the set and reset terminals of a plurality of flip-flops in the LSI circuit. This means that processing steps for inserting the control buffers must be executed following logic synthesis.

Furthermore, delay time following the insertion of the control buffer circuits differs from that which initially prevailed at the time of design. As a consequence, there are case where it becomes necessary to separately carry out a delay test and a delay adjustment based upon insertion of a CTS (clock tree synthesis) buffer.

In addition, when the above-described method is used, it is necessary to place the control buffer circuits in close proximity to the set and reset terminals of the flip-flop. In certain cases this affects layout design and the like.

In a case where the output of one control buffer is supplied to a plurality of flip-flops at different locations, there are instances where the set and reset signals develop differences in delay time owing to differences in the wiring length and load, etc., of the set and reset signal wires between flip-flops. This makes it necessary to separately bring these delay times into agreement.

The circuit according to the present invention seeks to improve upon the above-mentioned difficulties. Preferably, the flip-flop circuit is internally provided with a logic circuit that perform mask control so as to inhibit the transmission of an entered set signal and/or reset signal when the control signal SMC, which controls changeover between the scan path test mode and the normal operation mode, is active. Specifically, the flip-flop has internal circuits (105 and 106 in FIG. 1) for masking the set and reset signals when the control signal SMC is at the high level (i.e., when the control signal SMC indicates the scan path test mode).

In accordance with the flip-flop thus constructed, setting and resetting of the flip-flop is prevented when a shift operation is performed at the time of the scan path test. In addition, the step of inserting the control buffer is no longer necessary and verifying delay after insertion of the control buffer also is no longer required. It is also unnecessary to supply the output of one control buffer to flip-flops at a plurality of different locations, as a result of which circuit design is simplified.

An embodiment of the present invention will now be described in greater detail with reference to the drawings.

Figure 1:
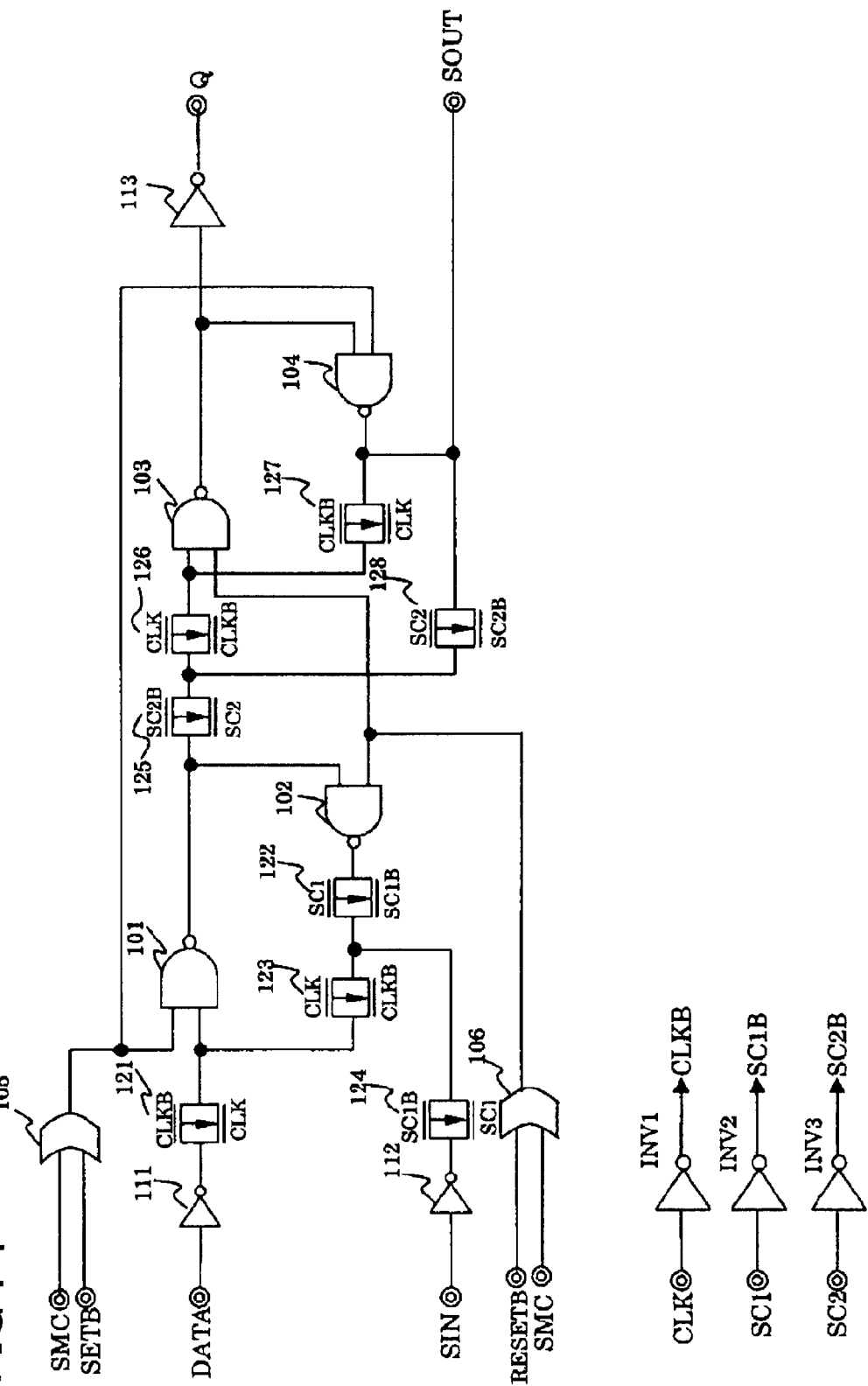
FIG. 1 is a diagram illustrating the structure of a flip-flop according to an embodiment of the present invention.

FIG. 1 is a diagram showing an example of the structure of a flip-flop according to an embodiment of the present invention. The flip-flop shown in FIG. 1 is a master/slave-type flip-flop having reset and set functions and comprises the master latch constructed by the first NAND gate 101 and second NAND gate 102, and the slave latch constructed by the third NAND gate 103 and fourth NAND gate 104.

Figure 4:
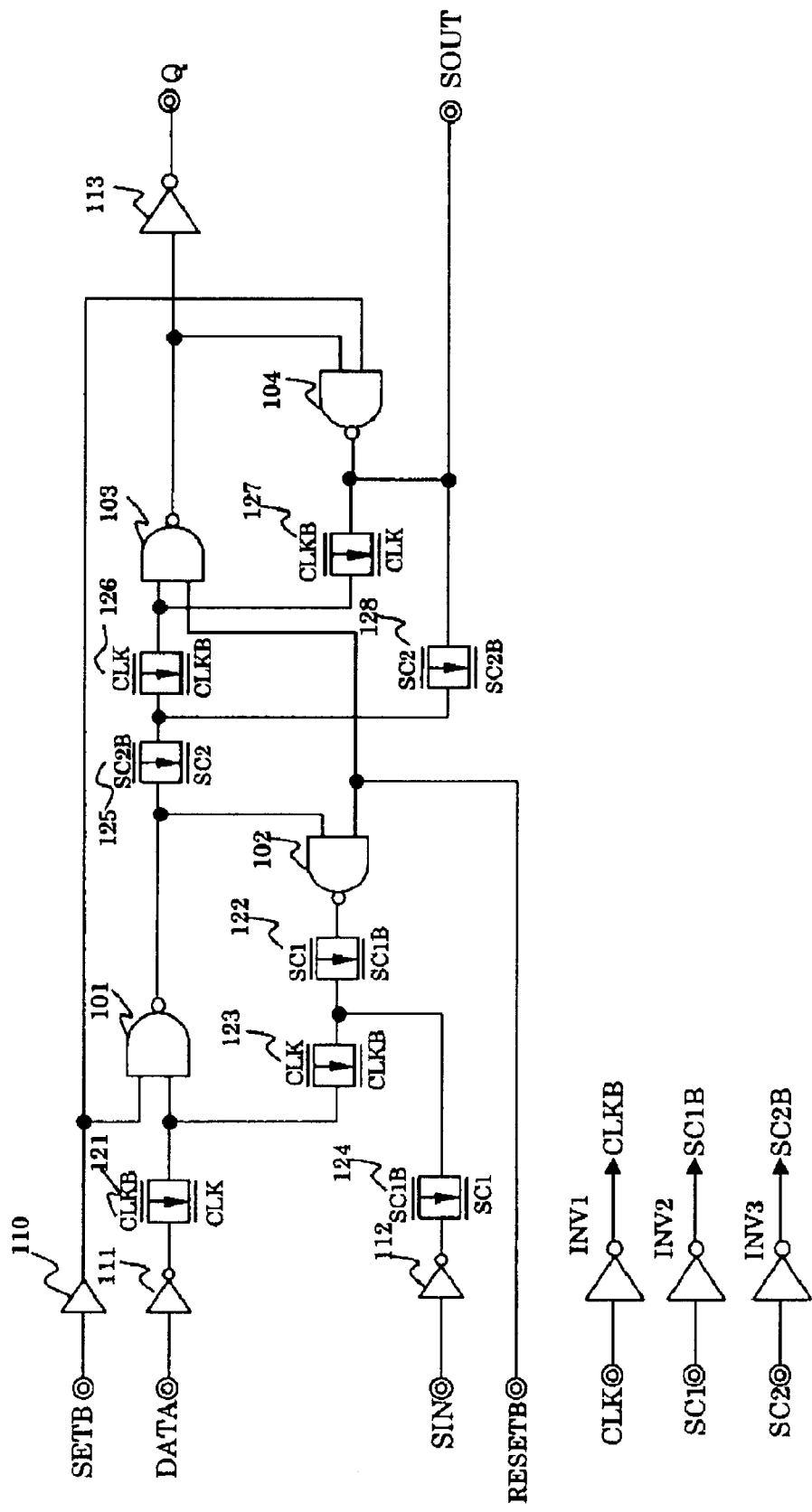
FIG. 4 is a diagram illustrating the structure of a scan path flip-flop having a set/reset function according to the prior art.

As shown in FIG. 1, the flip-flop is obtained by additionally providing the arrangement of FIG. 4 with a first OR gate 105 whose input terminals are connected to the set terminal SETB from which the set signal is input and to the control terminal SMC to which is input the control signal SMC that controls the changeover between the scan path test mode and ordinary operating mode, and a second OR gate 106 whose input terminals are connected to the reset terminal SETB from which the reset signal is input and to the control terminal SMC. The output of the first OR gate 105 is connected to first input terminals of the first and fourth first NAND gates 101, 104.

The first inverter 111 has its input terminal connected to the data terminal DATA, and the first CMOS transfer gate 121, which is turned on and off by the clock CLK, is provided between the output terminal of the first inverter 111 and the second input terminal of the first NAND gate 101.

The output terminal of the first NAND gate 101 is connected to the second input terminal of the second NAND gate 102, the first input terminal of the second NAND gate 102 is connected to the reset terminal (inverting) RESETB, and the second and third CMOS transfer gates 122 and 123, respectively, are serially connected between the output terminal of the second NAND gate 102 and the second input terminal of the first NAND gate 101. The second and third CMOS transfer gates 122 and 123 are turned on and off by the first scan clock SC1 and clock CLK, respectively.

The scan-in input terminal SIN is connected to the input terminal of the second inverter 112, and the fourth CMOS transfer gate 124, which is turned on and off by the first scan clock SC1, is connected between the output terminal of the second inverter 112 and the connection node of the second and third CMOS transfer gates 122 and 123, respectively.

The fifth and sixth CMOS transfer gates 125 and 126 are serially connected between the output terminal of the first NAND gate 101 and the first input terminal of the third NAND gate 103. The fifth and sixth CMOS transfer gates 125 and 126 are turned on and off by the second scan clock SC2 and clock CLK, respectively. The third NAND gate 103 has its second input terminal connected to the output terminal of the second OR gate 106.

The third NAND gate 103 has its output end connected to the output terminal Q via the third inverter 113, and the third NAND gate 103 has its output end connected to the second input terminal of the fourth NAND gate 104. The first input terminal of the fourth NAND gate 104 is connected to the output terminal of the first OR gate 105.

The seventh CMOS transfer gate 127, which is turned on and off by the clock signal CLK, is connected between the output terminal of the fourth NAND gate 104 and the input terminal of the third NAND gate 103. The output terminal of the fourth NAND gate 104 is connected to the scan-out output terminal SOUT. The eighth CMOS transfer gate 128, which is turned on and off by the second scan clock SC2, is connected between the output terminal of the fourth NAND gate 104 and the node of the fifth and sixth CMOS transfer gates 125 and 126.

The inverted clock CLKB and the uninverted clock CLK are supplied to the gates of the P-channel MOS transistor and N-channel MOS transistor of the first and seventh CMOS transfer gates 121 and 127, and the uninverted clock CLK and inverted clock CLKB are supplied to the gates of the P-channel MOS transistor and N-channel MOS transistor of the third and sixth CMOS transfer gates 123 and 126.

The uninverted scan clock SC1 and the inverted scan clock SC1B are supplied to the gates of the P-channel MOS transistor and N-channel MOS transistor of the second CMOS transfer gate 122.

The inverted scan clock SC1B and the uninverted scan clock SC1 are supplied to the gates of the P-channel MOS transistor and N-channel MOS transistor of the fourth CMOS transfer gate 124.

The inverted scan clock SC2B and the uninverted scan clock SC2 are supplied to the gates of the P-channel MOS transistor and N-channel MOS transistor of the fifth CMOS transfer gate 125.

The uninverted scan clock SC2 and inverted scan clock SC2B are supplied to the gates of the P-channel MOS transistor and N-channel MOS transistor of the eighth CMOS transfer gate 128.

During ordinary operation, the control signal SMC is placed at the low level, the first scan clock SC1 at the low level and the second scan clock SC2 at the high level.

As a result of the first and second scan clocks SC1 and SC2 being fixed at the low and high levels, respectively, the second CMOS transfer gate 122 is placed in the ON state, the fourth CMOS transfer gate 124 in the OFF state, the fifth CMOS transfer gate 125 in the ON state and the eighth CMOS transfer gate 128 in the OFF state, and the connection from the scan-in terminal SIN to the master latch and the connection path between the slave latch and the scan-out terminal SOUT are cut.

Figure 5:
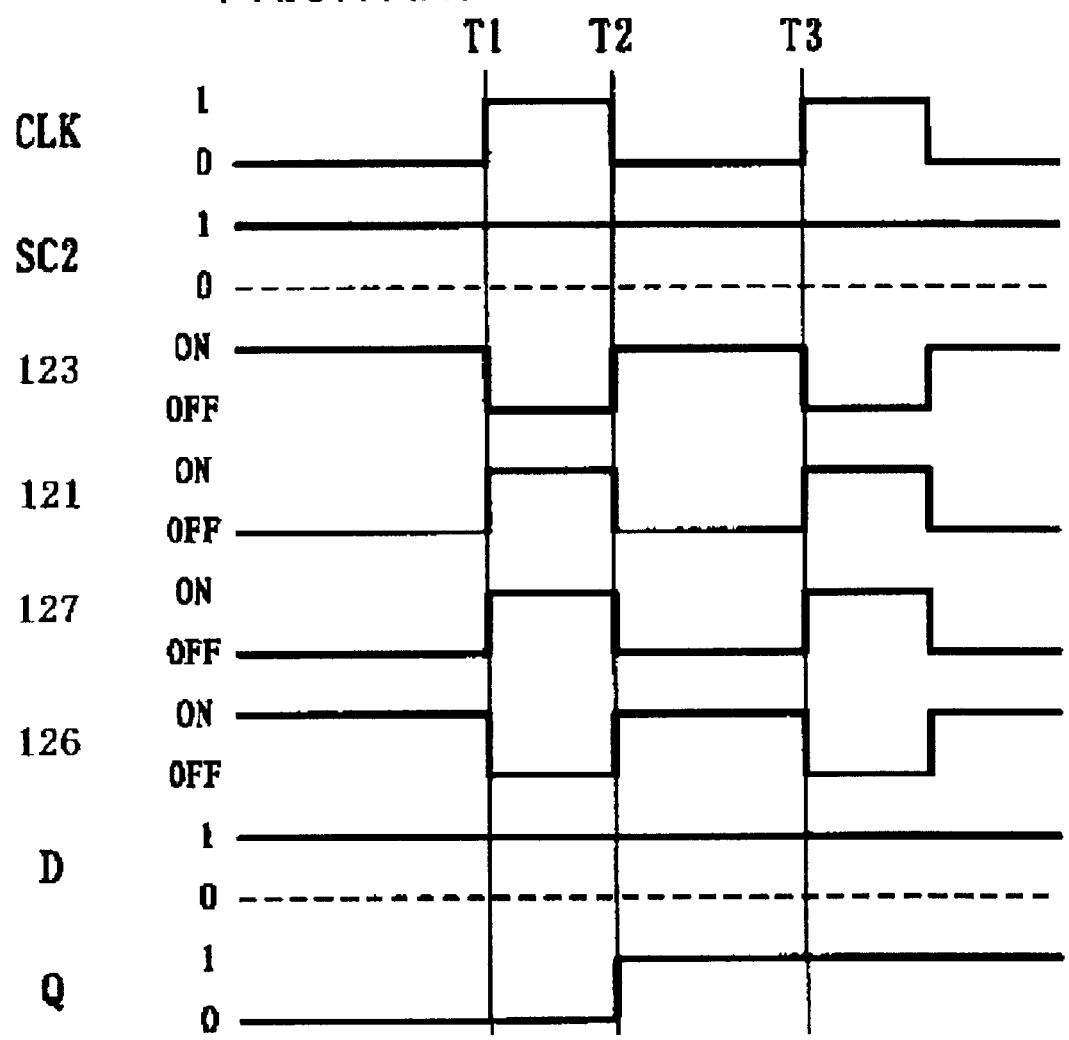
FIG. 5 is a timing chart illustrating an example of operation (in the normal operation mode) of the scan path flip-flop having the set/reset function according to the prior art.

When the signal value of the control signal SMC is at the low level, the first and second OR gates 105 and 106 deliver the signals at the set terminal SETB and reset terminal RESETB as is. When the set terminal SETB and reset terminal RESETB are at the high level, the setting and resetting operations are not carried out. In other words, the flip-flop of this embodiment operates in a manner similar to that described above with reference to FIG. 5. This operation need not be described again here (refer to the description rendered in connection with FIG. 5). It should be noted that if the second scan clock SC2 and its inverted signal SC2B connected to the P-channel MOS transistor and N-channel MOS transistor of the fifth and eighth CMOS transfer gates 125, 128 are made the opposite of the what is shown in FIG. 1, then the second scan clock SC2 will be fixed at the low level at the time of normal operation.

When the set terminal SETB assumes the low level, the first OR gate 105 outputs the low level to the input ends of the first and fourth NAND gates 101 and 104, and the output terminal Q outputs the high level owing to the low level of the clock CLK. When the reset terminal RESETB is at the low level, the second OR gate 106 outputs the low level to the input ends of the second and third NAND gates 102 and 103, and the output terminal Q outputs the low level.

Operation at the time of the scan path test is as follows: When the signal value at the control terminal SMC is at the high level, the first and second OR gates 105 and 106 mask the input signals at the set terminal SETB and reset terminal RESETB and output the high level, which is the fixed value. The low-level signals at the set terminal SETB and reset terminal RESETB are not transmitted and output to the output ends of the first and second OR gates 105 and 106, and the state of the flip-flop is neither set nor reset even though the signals at the set terminal SETB and reset terminal RESETB assume the low level.

More specifically, when the signal at the control terminal SMC is at the high level, the scan mode is established. Even if the signal at the set terminal SETB is at the low level, the output signal of the first OR gate 105 remains at the high level and the first and fourth NAND gates 101 and 104 function as two-stage inverters (latch circuits) for inverting the logic levels at their second input terminals. As a consequence, the flip-flop is not placed in the set state. That is, the master latch constituted by the first NAND gate 101 and second NAND gate 102 reads in the signal at the scan-in terminal SIN at the high level of the first scan clock SC1, the slave latch constituted by the third NAND gate 103 and fourth NAND gate 104 reads in the output of the master latch at the high level of the second scan clock SC2, and the scan-out terminal SOUT delivers the signal at the scan-in terminal SIN.

Even if the signal at the reset terminal RESETB is at the low level when the signal at the control terminal SMC is at the high level, the output signal of the second OR gate 105 remains at the high level and the second and third NAND gates 102 and 103 function as two-stage inverters (latch circuits) for inverting the logic levels at their second input terminals. As a consequence, the flip-flop is not placed in the reset state. In this case also the master latch constituted by the first NAND gate 101 and second NAND gate 102 reads in the signal at the scan-in terminal SIN at the high level of the first scan clock SC1, the slave latch constituted by the third NAND gate 103 and fourth NAND gate 104 reads in the output of the master latch at the high level of the second scan clock SC2, and the scan-out terminal SOUT delivers the signal at the scan-in terminal SIN.

Figure 6:
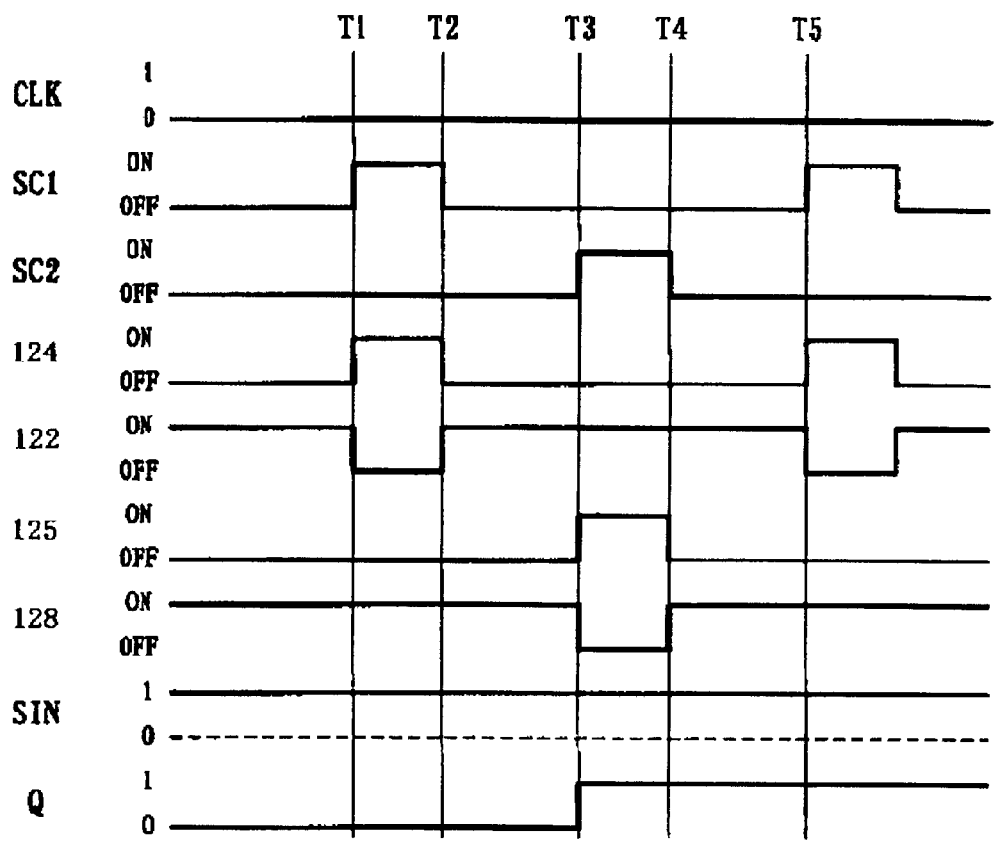
FIG. 6 is a timing chart illustrating an example of operation (in the scan path test mode) of the scan path flip-flop having the set/reset function according to the prior art.

In this embodiment, operation in a case where the set signal and reset signal are not rendered active when the scan path test is conducted is similar to that described above with reference to FIG. 6. This operation need not be described again here (refer to the description rendered in connection with FIG. 6). It should be noted that if the second scan clock SC2 and its inverted signal SC2B connected to the P-channel MOS transistor and N-channel MOS transistor of the fifth and eighth CMOS transfer gates 125 and 128 are made the opposite of the what is shown in FIG. 1, then the second scan clock SC2 will become a signal that is the inverse of the signal shown in FIG. 6 (i.e., the high/low levels of the signal will be reversed) indicative of operation at the time of the scan path test.

FIG. 2 is a diagram illustrating the operation of the flip-flop of this embodiment summarized in the form of a table. FIG. 2 shows that when the scan shift mode, in which the control terminal SMC is in the active state, is in effect, the signal at the scan-in input terminal SIN is output at the scan-out terminal SOUT and output terminal Q of the flip-flop regardless of the values of the set and reset signals. In the ordinary operating (Normal) mode and in the set and reset modes (Set and Reset in FIG. 2) in which the control terminal SMC is in the inactive state, data output, set and reset operations, respectively, are performed at the output terminal Q, as described above.

The flip-flop shown in FIG. 1 preferably is stored in a library as a standard cell (primitive cell) used in logic design and logical synthesis. In this case, such information as the propagation delay time of the flip-flop is stored in the library in advance.

In accordance with this embodiment, a circuit for masking the set, and reset signals in dependence upon the value of the scan path test mode signal is incorporated within the flip-flop. As a result, at the time of the scan path test, the arrangement becomes one in which flip-flops constructing a shift register are not set or reset. The designing of test patterns is facilitated.

In accordance with this embodiment, the flip-flop is used as a macro (primitive cell) in logical synthesis. Following logical synthesis, therefore, a step of inserting a control buffer circuit is no longer necessary. This simplifies the circuit design process.

Further, in accordance with this embodiment, control buffer circuits are not inserted. This is advantageous in that it is possible to dispense with steps of delay analysis and delay adjustment necessitated when control buffer circuits are inserted.

Further, in accordance with this embodiment, even if reset and set signals ascribable to noise or the like are rendered active at the time of a shift operation, flip-flops constructing a shift register are not reset or set. In addition, a large-scale integrated circuit device equipped with the flip-flop of this embodiment is tested more easily through use of a LSI tester or the like.

Though the present invention has been described in accordance with the foregoing embodiments, the invention is not limited to these embodiments and it goes without saying that the invention covers various modifications and changes that would be obvious to those skilled in the art within the scope of the claims.

The meritorious effects of the present invention are summarized as follows.

Thus, in accordance with the present invention, as described above, there is provided a circuit for inhibiting setting and resetting of a flip-flop owing to input of a set signal and reset signal when a shift operation is performed in a scan path test. As a result, it is possible to prevent the state of a flip-flop constructing a shift register from being disrupted at the time of a scan path test. This assures the shifting operation, simplifies circuit design, facilitates testing and enhances reliability.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items might fall under the modifications aforementioned.

What is claimed is:

1. A flip-flop for receiving and latching a data signal from a data terminal in a normal operation, and receiving and latching a signal from a scan input terminal in a scan path test operation, said flip-flop comprising:

a control terminal for receiving a control signal, which controls mode changeover between a scan path test mode and a normal operation mode;

a set terminal for receiving a set signal, which sets the state of said flip-flop;

a reset terminal for receiving a reset signal, which resets the state of said flip-flop;

a first logic circuit, which receives the control signal and set signal from said control terminal and said set terminal, respectively, for exercising control so as to inhibit transmission of the set signal, which has been entered from said set terminal, when the control signal indicates the scan path test mode, thereby not allowing the state of said flip-flop to be set by the entered set signal; and a second logic circuit, which receives the control signal and reset signal from said control terminal and said reset terminal, respectively, for exercising control so as to inhibit transmission of the reset signal, which has been entered from said reset terminal, when the control signal indicates the scan path test mode, thereby not allowing the state of said flip-flop to be reset by the entered reset signal;

wherein said flip-flop is comprised of a master/slave-type flip-flop including first and second logic gates having input and output terminals electrically connected to each other to compose a master latch, and third and fourth logic gates having input and output terminals electrically connected to each other to compose a slave latch;

wherein an output of said first logic circuit is connected to an input terminal of said first logic gate of said master latch, an output of said first logic gate fed to said second logic gate and to an input terminal of said fourth logic gate, which composes said slave latch, via a first switch and a second switch;

wherein said first switch and said second switch are provided in series, said first switch maintaining an ON state during a normal operation and being turned ON/OFF by a scan clock during scan path test, said second switch being turned ON/OFF by the clock during the normal operation and maintaining the ON state during scan test; and wherein an output of said second logic circuit is connected to an input terminal of said second logic gate that composes said master latch and to an input terminal of said third logic gate that composes said slave latch.

2. A semiconductor integrated circuit device having said flip-flop set forth in claim 1.

3. A flip-flop for receiving and latching a data signal from a data terminal in a normal operation, and receiving and latching a signal from a scan input terminal in a scan path test operation, said flip-flop comprising:

a control terminal for receiving a control signal, which controls mode changeover between a scan path test mode and a normal operation mode;

a set terminal for receiving a set signal, which sets the state of said flip-flop;

a reset terminal for receiving a reset signal, which resets the state of said flip-flop;

a first logic circuit, which receives the control signal and set signal from said control terminal and said set terminal, respectively, for exercising control so as to inhibit transmission of the set signal, which has been entered from said set terminal, when the control signal indicates the scan path test mode, thereby not allowing the state of said flip-flop to be set by the entered set signal; and a second logic circuit, which receives the control signal and reset signal from said control terminal and said reset terminal, respectively, for exercising control so as to inhibit transmission of the reset signal, which has been entered from said reset terminal, when the control signal indicates the scan path test mode, thereby not allowing the state of said flip-flop to be reset by the entered reset signal;

wherein said flip-flop is comprised of a master/slave-type flip-flop including first and second logic gates having input and output terminals electrically connected to each other to compose a master latch, and third and fourth logic gates having input and output terminals electrically connected to each other to compose a slave latch;

wherein an output of said first logic circuit is connected to an input terminal of said first logic gate of said master latch, an output of said first logic gate fed to said second logic gate and to an input terminal of said fourth logic gate, which composes said slave latch, via a switch;

wherein an output of said second logic circuit is connected to an input terminal of said second logic gate that composes said master latch and to an input terminal of said third logic gate that composes said slave latch; and wherein two-input first and second NAND gates compose the master latch and two-input third and fourth NAND gates compose the slave latch; and said flip-flop further comprises:

a first logic circuit having a plurality of input terminals connected to the set terminal to which the set signal is input and to the control terminal to which the control signal for controlling mode changeover between the scan path test mode and the normal operation mode is input;

said second logic circuit having a plurality of input terminals connected to the reset terminal to which the reset signal is input and to the control terminal to which the control signal for controlling mode changeover between the scan path test mode and the normal operation mode is input, wherein the output of said first logic circuit is entered to one input terminal of said first NAND gate;

a first inverter having an input terminal connected to the data terminal for receiving data signal;

a first transfer gate, which is turned on and off by a clock signal, connected between the output terminal of said first inverter and another input terminal of said first NAND gate, wherein the output terminal of said first NAND gate is connected to one input terminal of said second NAND gate; and the output terminal of said second logic circuit is connected to another input terminal of said second NAND gate;

second and third transfer gates serially connected between the output terminal of said second NAND gate and the other input terminal of said first NAND gate, wherein said second and third transfer gates have a first scan clock and a clock, respectively, supplied to control terminals thereof and are turned on and off by said first scan clock and said clock, respectively, said first scan clock is made a fixed value at the time of the normal operation and said clock is made a fixed value at the time of the scan path test;

a second inverter having an input terminal connected to the scan input terminal;

a fourth transfer gate, which is turned on and off by the first scan clock, connected between the output terminal of said second inverter and a connection node of said second and third transfer gates;

fifth and sixth transfer gates, which are turned on and off by a second scan clock and clock, respectively, serially connected between the output terminal of said first NAND gate and one input terminal of said third NAND gate, wherein the second scan clock is made a fixed value at the time of the normal operation, and the first and second scan clocks are supplied and the clock is made the fixed value at the time of the scan path test, and the output terminal of said second logic circuit is connected to the other input terminal of said third NAND gate, a third inverter having an input terminal connected to an output terminal of said third NAND gate and an output terminal connected to a data output terminal and to one input terminal of said fourth NAND gate, wherein the other input terminal of said fourth NAITD gate is connected to the output terminal of said first logic circuit;

a seventh transfer gate, which is turned on and off by the clock, connected between the output terminal of said fourth NAND gate and one input terminal of said third NAND gate, wherein the output terminal of said fourth NAND gate is connected to a scan-out output terminal; and an eighth transfer gate, which is turned on and off by the second scan clock, connected between the output terminal of said fourth NAND gate and a connection node of said fifth and sixth transfer gates.

* * * * *

UNITED STATES PATENT AND TRADEMARK OFFICE
CERTIFICATE OF CORRECTION

| | | |
|---|---|---|
| PATENT NO. | : 7,024,605 B2 | Page 1 of 1 |
| APPLICATION NO. | : 10/197583 | |
| DATED | : April 4, 2006 | |
| INVENTOR(S) | : Yoshiaki Sera and Kouji Kanba | |

It is certified that error appears in the above-identified patent and that said Letters Patent is hereby corrected as shown below:

Column 16, line 35 (claim 3) delete "NAITD", and insert --NAND--.

Signed and Sealed this

Sixteenth Day of January, 2007

JON W. DUDAS
*Director of the United States Patent and Trademark Office*